(12) United States Patent
Cho et al.

(10) Patent No.: US 10,355,030 B2
(45) Date of Patent: Jul. 16, 2019

(54) DISPLAY PANEL AND DISPLAY APPARATUS

(71) Applicants: HKC Corporation Limited, Shenzhen (CN); Chongqing HKC Optoelectronics Technology Co., ltd., Chongqing (CN)

(72) Inventors: En-Tsung Cho, Chongqing (CN); Kun Fan, Chongqing (CN); Yiqun Tian, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/869,136

(22) Filed: Jan. 12, 2018

(65) Prior Publication Data

US 2018/0190684 A1 Jul. 5, 2018

Related U.S. Application Data

(63) Continuation of application No. PCT/CN2017/084125, filed on May 12, 2017.

(30) Foreign Application Priority Data

Dec. 30, 2016 (CN) .......................... 2016 1 1264002

(51) Int. Cl.
*H01L 27/00* (2006.01)
*H01L 29/00* (2006.01)
(Continued)

(52) U.S. Cl.
CPC .......... *H01L 27/1255* (2013.01); *B82Y 10/00* (2013.01); *H01L 28/40* (2013.01);
(Continued)

(58) Field of Classification Search
CPC ............ H01L 27/1255; H01L 27/3265; H01L 27/3262; H01L 27/3246; H01L 27/1288;
(Continued)

(56) References Cited

U.S. PATENT DOCUMENTS 6,479,391 B2 * 11/2002 Morrow ............ H01L 21/31144
257/E21.257
8,349,630 B1 * 1/2013 Hsu ..................... H01L 27/1288
257/E21.536
(Continued)

OTHER PUBLICATIONS

Barber et al., "Polymer Composite and Nanocomposite Dielectric Materials", 2009, Materials 2009, 2, 1697-1733; Published: Oct. 29, 2009.*
(Continued)

*Primary Examiner* — Nikolay K Yushin
(74) *Attorney, Agent, or Firm* — WPAT, PC

(57) ABSTRACT

A display panel and a display apparatus are provided. The display panel includes: a substrate; multiple first-layer wires disposed on the substrate; and an insulating dielectric layer disposed on the first-layer wires. A dielectric constant of the insulating dielectric layer is higher than dielectric constants of silicon oxide layer and silicon nitride layer. The insulating dielectric layer includes a composition. The composition includes a first component and a second component. A dielectric constant of the first component is lower than the dielectric constants of silicon oxide layer and silicon nitride layer. A dielectric constant of the second component is higher than the dielectric constants of silicon oxide layer and silicon nitride layer.

3 Claims, 3 Drawing Sheets

(51) Int. Cl.
  *H01L 27/12*   (2006.01)
  *H01L 49/02*   (2006.01)
  *H01L 29/49*   (2006.01)
  *H01L 29/786*  (2006.01)
  *B82Y 10/00*   (2011.01)
  *H01L 29/06*   (2006.01)
  *G02F 1/1362*  (2006.01)
  *G02F 1/1368*  (2006.01)
  *H01L 27/32*   (2006.01)

(52) U.S. Cl.
  CPC ...... *H01L 29/0665* (2013.01); *H01L 29/4908* (2013.01); *H01L 29/78606* (2013.01); *G02F 1/1368* (2013.01); *G02F 1/136213* (2013.01); *H01L 27/1288* (2013.01); *H01L 27/3246* (2013.01); *H01L 27/3262* (2013.01); *H01L 27/3265* (2013.01); *H01L 29/78669* (2013.01)

(58) Field of Classification Search
  CPC ............... H01L 28/40; H01L 29/78606; H01L 29/4908; H01L 29/78669; G02F 1/136213; G02F 1/1368; G02F 1/134363; G02F 1/136277
  See application file for complete search history.

(56) References Cited

U.S. PATENT DOCUMENTS 8,786,090 B2 * 7/2014 Gotou ............... H01L 23/53219
                                                  257/765
2010/0065847 A1 * 3/2010 Gotou ............... H01L 23/53219
                                                  257/59

OTHER PUBLICATIONS

Mujahid et al., "Study of chain scission versus crosslinking in MeV . . . ", 2004, Radiation Measurements 38 (2004) 197-203, Jan. 2004.*

Rath et al., "Organic amine-functionalized silica-based mesoporous materials: an update of syntheses and catalytic applications", 2014, RSC Adv., 2014, 4, 57111-57124 (Sep. 11, 2014).*

* cited by examiner

DISPLAY PANEL AND DISPLAY APPARATUS

FIELD OF THE DISCLOSURE

The disclosure relates to the field of display technology, and more particularly to a display panel and a display apparatus.

BACKGROUND

Displays are widely applied due to numerous advantages such as thin bodies, energy saving, radiation-free, etc. Most of displays available on the market are backlight-type displays, and such display includes a display panel and a backlight module. The working principle of the display panel is placing liquid crystal molecules between two parallel substrates and applying a driving voltage on the two substrates to control rotation directions of the liquid crystal molecules, for refracting rays of the backlight module to generate images.

A thin film transistor-liquid crystal display (TFT-LCD) gradually occupies the dominant position in the display realm at present because of its properties such as low energy consumption, superior image quality and relatively high production yield, etc. Identically, the TFT-LCD includes a display panel and a backlight module. The display panel includes a color filter (CF) substrate and a thin film transistor (TFT) array substrate. The opposite internal sides of the substrates have transparent electrodes. A layer of liquid crystal (LC) molecules are interposed between the two substrates. The display panel controls the orientation of liquid crystal molecule by an electric field, changes the polarization state of light and realizes transmitting and blocking of optical path by polarizing plates and thereby achieves the purpose of displaying.

As sizes of integrated circuits, chips and TFT-LCDs are constantly decreasing and package densities of devices are continuously increasing, and therefore requirements of various aspects of material performance are continuously increased. With the device scaling down, the thickness of current gate oxide insulating layer becomes very thin, and for the scaled down device, the thickness of the gate oxide insulating layer will become thinner, which requires a new high-k gate oxide insulating dielectric material.

SUMMARY

A technical problem to be solved by the disclosure is to provide a display panel and a display apparatus whose insulating dielectric layer has a high dielectric constant.

An objective of the disclosure is achieved by following embodiments.

In particular, a display panel includes:

a substrate;

a plurality of first-layer wires, the plurality of first-layer wires being disposed on the substrate;

an insulating dielectric layer, the insulating dielectric layer being disposed on the plurality of first-layer wires, a dielectric constant of the insulating dielectric layer being higher than dielectric constants of silicon oxide layer and silicon nitride layer, the insulating dielectric layer including a composition, and the composition including a first component and a second component.

In an embodiment, the first component includes a nanoporous silicon.

The nanoporous silicon may be made to be very thin, which can reduce the thickness of the insulating dielectric layer and meet the needs of decreasing sizes of integrated circuits, chips and TFT-LCDs. The nanoporous silicon itself is hydrophobic.

In an embodiment, the second component includes a germanium (Ge) nanoparticle.

A dielectric constant of the germanium is 16, the dielectric constant of the insulating dielectric layer is increased by adjusting a ratio of the germanium. Of course, other metal with high dielectric constant and other material may be used instead.

In an embodiment, the first component includes a nanoporous silicon, and the second component includes a germanium nanoparticle.

The nanoporous silicon may be made to be very thin, which can reduce the thickness of the insulating dielectric layer and meet the needs of decreasing sizes of integrated circuits, chips and TFT-LCDs. The nanoporous silicon itself is hydrophobic. The dielectric constant of germanium is 16, the nanoporous silicon itself has multiple silicon holes, the germanium nanoparticle may be stored in the silicon hole and thus it would not increase the thickness of the nanoporous silicon. A controllable adjustment of dielectric coefficient can be realized by adjusting the load amount of the germanium nanoparticle.

In an embodiment, the insulating dielectric layer includes a nanoporous silicon, the nanoporous silicon includes multiple hollow cylindrical subassemblies connected with one another, a cross-section of the subassembly is hexagonal, the subassembly has a circular through hole in the middle thereof, the circular through hole of the subassembly is disposed with multiple silicon holes, and the silicon hole has a germanium nanoparticle disposed therein.

The cross-section of the subassembly of the porous silicon is hexagonal, which facilitates multiple subassemblies to be spliced and arranged. The silicon hole may have multiple germanium nanoparticles disposed therein, which would not affect the thickness of the porous silicon.

In an embodiment, an amorphous silicon layer is disposed on the insulating dielectric layer and corresponding to a gate conductor segment, an ohmic contact layer is disposed on and corresponding to the amorphous silicon layer, a source conductor segment and a drain conductor segment are separated from each other and disposed on the ohmic contact layer, the source conductor segment and the drain conductor segment have a channel disposed therebetween, the channel passes through the ohmic contact layer, the bottom of the channel is the amorphous silicon layer, a width of the source conductor segment and the drain conductor segment as a whole is greater than a width of the amorphous silicon layer, a second insulating layer is disposed on the source conductor segment and the drain conductor segment, a pixel electrode layer is disposed on the second insulating layer, the second insulating layer is formed with a via hole corresponding to the drain conductor segment, and the pixel electrode layer is connected with the drain conductor segment by the via hole.

A thin film transistor (TFT) with better performance may be obtained by a five-mask process.

In an embodiment, an amorphous silicon layer is disposed on the insulating dielectric layer and corresponding to a gate conductor segment, an ohmic contact layer is disposed on and corresponding to the amorphous silicon layer, a source conductor segment and a drain conductor segment are separated from each other and disposed on the ohmic contact layer, a channel is disposed between the source conductor segment and the drain conductor segment, the channel passes through the ohmic contact layer, the bottom of the channel is the amorphous silicon layer, widths of the source conductor segment and the drain conductor segment each are equal to a width of the ohmic contact layer contacted therewith, a second insulating layer is disposed on the source conductor segment and the drain conductor segment, a pixel electrode layer is disposed on the second insulating layer, the second insulating layer is formed with a via hole corresponding to the drain conductor segment, the pixel electrode layer is connected to the drain conductor segment by the via hole.

A thin film transistor with better performance may be obtained by a four-mask process and further one mask step is saved.

In an embodiment, a relative dielectric constant of the second insulating layer as a low-k protective layer is lower than relative dielectric constants of silicon nitride and silicon oxide.

The use of low-k protective layer may improve device performance of thin film transistor and improve problems of signal crosstalk and delay of RC circuit.

In an embodiment, the low-protective layer includes a mesoporous silica.

A relative dielectric constant of the mesoporous silica is $\varepsilon r=1.4\sim2.4$, the low-k protective layer uses the mesoporous silicon to replace the protective layer material SiNx (relative dielectric constant $\varepsilon r=7\sim8$) in TFT devices obtained by a 5-mask process and a 4-mask process, the $\varepsilon r$ of the mesoporous silica is lower than that of an ordinary silica (relative dielectric constant $\varepsilon r=3.9\sim4.1$), which can improve the device performance of TFT, improve problems of signal crosstalk and delay of RC circuit, and reduce the thickness of the low-k protective layer. Of course, the low-k protective layer may use other low-k material such as nanoporous silicon.

In an embodiment, the mesoporous silica includes multiple subunits, the subunit includes subparts arranged in three rows, the middle row in the subunit includes three subparts juxtaposed with one another, a first row and a third row in the subunit each include two subparts juxtaposed with each other, the two subparts in each of the first row and the third row each are located between any two subparts of the three subparts in the middle row, a cross-section of the subpart is hexagonal, and the subpart has a circular through hole formed in the middle thereof.

The subunit has subparts arranged in a regular order, which may have high specific surface area and good thermal stability and water heat stability; sizes of through holes of the subparts are even and the cross-section of the subpart is hexagonal, which facilitates multiple subparts to be spliced and arranged.

The dielectric constant of the insulating dielectric layer disposed on the first-layer wires is higher than dielectric constants of silicon oxide layer and silicon nitride layer, which can increase the charge storage capacity of device. The insulating dielectric layer includes a composition, and the composition includes a first component and a second component. A dielectric constant of the first component is lower than the dielectric constants of silicon oxide layer and silicon nitride layer, a dielectric constant of the second component is higher than the dielectric constants of silicon oxide layer and silicon nitride layer, the dielectric constant of the insulating dielectric layer is adjustable by adjusting a ratio of the first component and the second component.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF EMBODIMENTS

Figure 1:
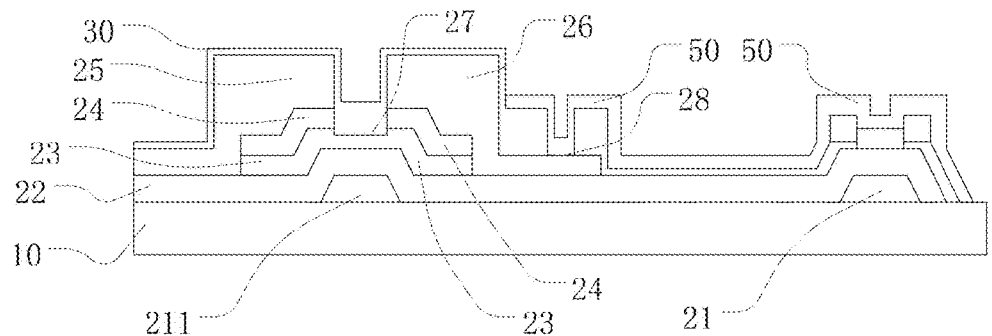
FIG. 1 is a schematic view of a TFT device of a five-mask process according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "include" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "include" and/or "contain" define the existence of described features, integers, steps, operations, units and/or components, but do not exclude the existence or addition of one or more other features, integers, steps, operations, units, components and/or combinations thereof.

The disclosure will be further described below with reference to accompanying drawings and preferred embodiments.

A display panel of an embodiment of the disclosure will be described below with reference to FIG. 1 through FIG. 8.

As shown in FIG. 1, the display panel in the embodiment associated with FIG. 1 includes a substrate 10. The substrate 10 has a plurality of first-layer wires 21 disposed thereon. The first-layer wires 21 has an insulating dielectric layer 22 disposed thereon. The insulating dielectric layer 22 is made of silicon nitride or silicon oxide. The insulating dielectric layer 22 has an amorphous silicon layer 23 disposed thereon and corresponding to a gate conductor segment 211 of the first-layer wires 21. The amorphous silicon layer 23 has an ohmic contact layer 24 thereon and corresponding to the amorphous silicon layer 23. The ohmic contact layer 24 has a source conductor segment 25 and a drain conductor segment 26 separated from each other. The source conductor segment 25 and the drain conductor segment 26 have a channel disposed therebetween. The channel 27 penetrates through the ohmic contact layer 24. The bottom of the channel 27 is the amorphous silicon layer 23. A width of the source conductor segment 25 and the drain conductor segment 25 as a whole is greater than a width of the amorphous silicon layer 23. The width of the amorphous silicon layer 23 is equal to that of the ohmic contact layer 24. The source conductor segment 25 and the drain conductor segment 26 have a protective layer 30 disposed thereon. The protective layer 30 has a pixel electrode layer 50 disposed thereon. The protective layer 30 is provided with a via hole 28 corresponding to the drain conductor segment 26. The pixel electrode layer 59 is connected with the drain conductor segment 26 by the via hole 28. For the portion of the source conductor segment 25 beyond the amorphous silicon layer 23, a side thereof is directly connected with the insulating dielectric layer 22 and another side thereof is directly connected with the protective layer 30. The portion of the insulating dielectric layer 22 corresponding to the via hole 28 is directly connected with the drain conductor segment 26. Therefore, a thin film transistor obtained by a five-Mask process would have good performance.

Figure 2:
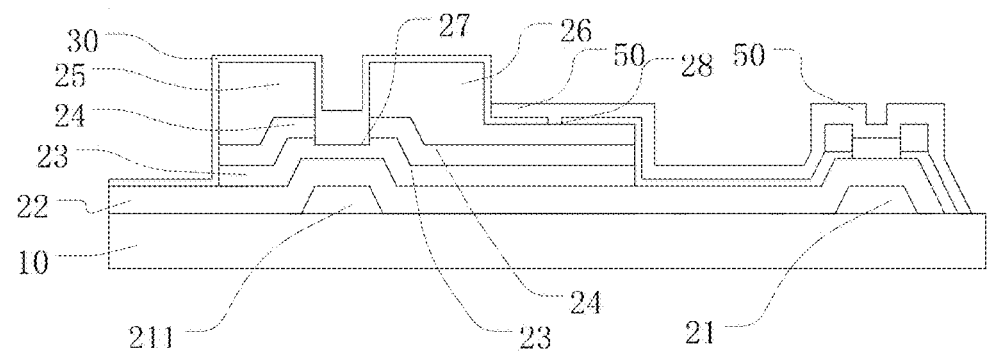
FIG. 2 a schematic view of a TFT device of a four-mask process according to an embodiment of the disclosure.

As shown in FIG. 2, the display panel in the embodiment associated with FIG. 2 includes a substrate 10. A plurality of first-layer wires 21 are disposed on the substrate 10. An insulating dielectric layer 22 is disposed on the first-layer wires 21. The insulating dielectric layer 22 is made of silicon nitride or silicon oxide. An amorphous silicon layer 23 is disposed on the insulating dielectric layer 22 and corresponding to the gate conductor segment 211 of the first-layer wires 21. An ohmic contact layer 24 is disposed on the amorphous silicon layer 23 and corresponding to the amorphous silicon layer 23. A source conductor segment 25 and a drain conductor segment 26 are separated from each other and disposed on the ohmic contact layer 24. A channel 27 is disposed between the source conductor segment 25 and the drain conductor segment 26. The channel 27 penetrates through the ohmic contact layer 24. The amorphous silicon layer 23 is located at the bottom of the channel 27. A width of the source conductor segment 25 and the drain conductor segment 26 as a whole is greater than a width of the amorphous silicon layer 23. The width of the amorphous silicon layer 23 is equal to that of the ohmic contact layer 24. A protective layer 30 is disposed on the source conductor segment 25 as well as the drain conductor segment 26. A pixel electrode layer 30 is disposed on the protective layer 30. The protective layer 30 is formed with a via hole 28 corresponding to the drain conductor segment 26. The pixel electrode layer 50 is connected with the drain conductor segment 26 by the via hole 28. The protective layer 30 located outside the source conductor segment 25 is directly connected with the insulating dielectric layer 22. The insulating dielectric layer 22 corresponding to the via hole 28 has the amorphous silicon layer 23, the ohmic contact layer 24 and the drain conductor segment 26 sequentially arranged thereabove in that order. Therefore, a thin film transistor obtained by a four-Mask process would have good performance and the process can save one Mask step.

Due to the progress of process and design, sizes of integrated circuits, chips and TFT-LCDs are constantly decreasing and package densities of devices are continuously increasing, and therefore requirements of various aspects of material performance are continuously improved. With the device scaling down, the thickness of current gate oxide insulating layer becomes very thin, and for the future scaled down devices, the thickness of the gate oxide insulating layer will become thinner, which requires a new high-k gate oxide insulating dielectric material. For the four-mask or five-mask TFT Array adopted by the above embodiment, in the thin film transistor, the gate dielectric layer and the above insulating protective layer have a very high voltage existed therebetween. The gate oxide layer will be affected by a tunneling current, when the insulating dielectric layer of the gate is very thin, electrons in the thin film transistor would tunnel through the insulating dielectric layer, which would cause a threshold voltage drift of the transistor and thereby cause the circuit to fail resulting from the switch state being not normally switched. The traditional gate oxide insulating dielectric materials (e.g., SiO2, SiNx) have not met the need of high packaging density of TFT-LCD devices.

Figure 3:
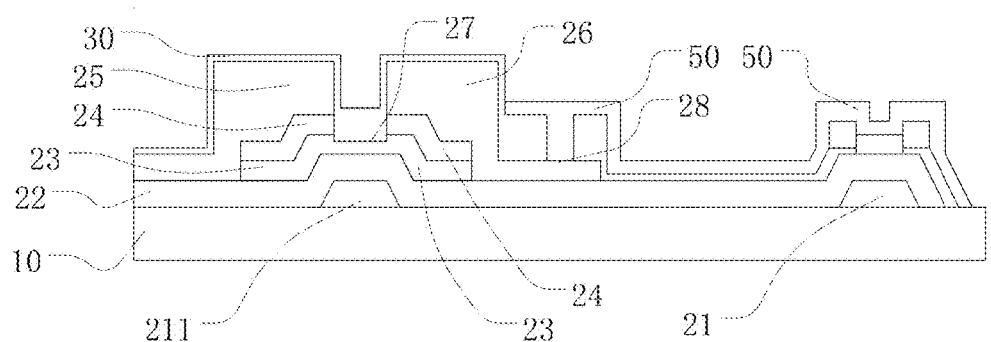
FIG. 3 is another schematic view of a TFT device of a five-mask process according to an embodiment of the disclosure.
Figure 4:
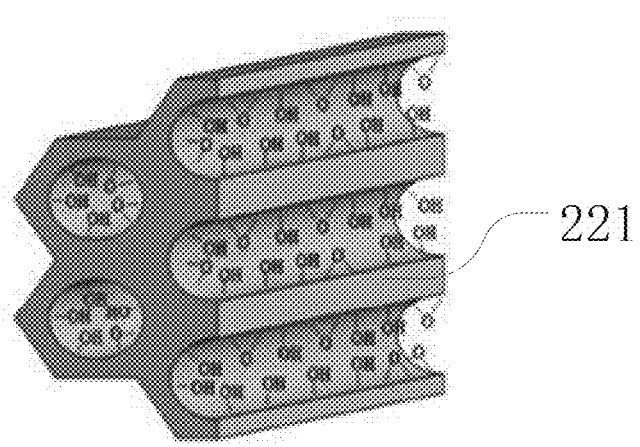
FIG. 4 is a schematic view of a nanoporous silicon according to an embodiment of the disclosure.
Figure 5:
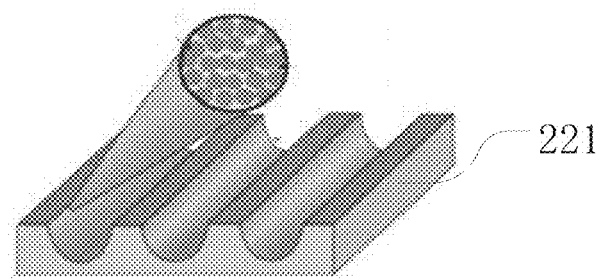
FIG. 5 is a schematic view of a nanoporous silicon and a germanium nanoparticle according to an embodiment of the disclosure.

As shown in FIG. 3, FIG. 4 and FIG. 5, the display panel of the embodiment associated with the FIG. 3, FIG. 4 and FIG. 5 includes: a substrate 10; a plurality of first-layer wires 21, the plurality of first-layer wires 21 being disposed on the substrate 10; an insulating dielectric layer 22, the insulating dielectric layer 22 being disposed on the plurality of first-layer wires 21, a dielectric constant of the insulating dielectric layer 22 being greater than dielectric constants of silicon oxide layer and silicon nitride layer, the insulating dielectric layer 22 including a composition, and the composition including a first component and a second component.

Since the dielectric constant of the insulating dielectric layer 22 disposed on the first-layer wires 21 is greater than the dielectric constants of silicon oxide layer and silicon nitride layer, it can increase charge storage capacity of the device. The insulating dielectric layer 22 includes the composition, and the composition includes the first component and the second component. A dielectric constant of the first component is smaller than the dielectric constants of silicon oxide layer and silicon nitride layer, and a dielectric constant of the second component is greater than the dielectric constants of silicon oxide layer and silicon nitride layer, and the dielectric constant of the insulating dielectric layer 22 is adjustable by adjusting a ratio of the first component and the second component.

Exemplarily, the first component includes a nanoporous silicon. The nanoporous silicon may be made to be very thin and can reduce the thickness of the insulating dielectric layer, and therefore can meet the needs of decreasing sizes of integrated circuits, chips and TFT-LCDs. The nanoporous silicon itself is hydrophobic.

Exemplarily, the second component includes a germanium nanoparticle. A dielectric constant of germanium is 16, and the dielectric constant of the insulating dielectric layer 22 can be increased by adjusting a ratio of the germanium, and of course other metal with high dielectric constant or other material may be used instead.

Exemplarily, the first component includes a nanoporous silicon material, and the second component includes a plurality of germanium nanoparticles. The nanoporous silicon material may be made to be very thin and can reduce the thickness of the insulating dielectric layer, and therefore can meet the needs of decreasing sizes of integrated circuits, chips and TFT-LCDs. The nanoporous silicon itself is hydrophobic. The dielectric constant of germanium is 16, the nanoporous silicon material itself has a lot of silicon holes, the germanium nanoparticles may be stored in the silicon holes and thus would not increase the thickness of the nanoporous silicon material, and a controllable adjustment of dielectric constant is realized by adjusting the loading of the germanium nanoparticles.

The insulating dielectric layer 22 includes the nanoporous silicon. The nanoporous silicon includes a plurality of hollow cylindrical subassemblies 221 connected with one another. A cross-section of each subassembly 221 is hexagonal, the subassembly 31 has a circular through hole in the middle thereof, the circular through hole of the subassembly 221 has a plurality of silicon holes, and the silicon holes are disposed with the germanium nanoparticle. The hexagonal cross-section of the subassembly 221 of the porous silicon facilitates the plurality of subassemblies 221 to be spliced together, the silicon holes are disposed with multiple germanium nanoparticles and thus the thickness of the porous silicon is not affected.

An amorphous silicon layer 23 is disposed on the insulating dielectric layer 22 and corresponding to a gate conductor segment 211. An ohmic contact layer 24 is disposed on the amorphous silicon layer 23 and corresponding to the amorphous silicon layer 23. A source conductor segment 25 and a drain conductor segment 26 are separated from each other and disposed on the ohmic contact layer 24. A channel 27 is disposed between the source conductor segment 25 and the drain conductor segment 26. The channel 27 penetrates through the ohmic contact layer 24. The amorphous silicon layer 23 is located at the bottom of the channel 27. A width of the source conductor segment 25 and the drain conductor segment 26 as a whole is greater than a width of the amorphous silicon layer 23. The width of the amorphous silicon layer 23 is equal to that of the ohmic contact layer 24. A second insulating layer 30 as a protective layer is disposed on the source conductor segment 25 and the drain conductor segment 26. A pixel electrode layer 50 is disposed on the second insulating layer 30. The second insulating layer 30 is provided with a via hole 28 corresponding to the drain conductor segment 26. The pixel electrode layer 50 is connected with the drain conductor segment 26 by the via hole 28. A side of the portion of the source conductor segment 25 beyond the amorphous silicon layer 23 is directly connected with the insulating dielectric layer 22, and the opposite side of the portion is directly connected with the low-k protective layer 30. The portion of the insulating dielectric layer 22 corresponding to the via hole 28 is directly connected with the drain conductor segment 26. Therefore, a thin film transistor with better performance can be obtained by a five-mask process.

As shown in FIG. 2, FIG. 4 and FIG. 5, the display panel of the embodiment associated with FIG. 2, FIG. 4 and FIG. 5 includes: a substrate 10; a plurality of first-layer wires 21, the plurality of first-layer wires 21 being disposed on the substrate 10; an insulating dielectric layer 22, the insulating dielectric layer 22 being disposed on the plurality of first-layer wires 21. A dielectric constant of the insulating dielectric layer 22 is greater than dielectric constants of silicon oxide layer and silicon nitride layer. The insulating dielectric layer 22 includes a composition, and the composition includes a first component and a second component.

Since the dielectric constant of the insulating dielectric layer 22 disposed on the first-layer wires 21 is greater than the dielectric constants of silicon oxide layer and silicon nitride layer, it can increase charge storage capacity of device. The insulating dielectric layer 22 includes the composition, and the composition includes the first component and the second component. A dielectric constant of the first component is smaller than the dielectric constants of silicon oxide layer and silicon nitride layer, and a dielectric constant of the second component is greater than the dielectric constants of silicon oxide layer and silicon nitride layer, and the dielectric constant of the insulating dielectric layer 22 is adjustable by adjusting a ratio between the first component and the second component.

Exemplarily, the first component includes a nanoporous silicon. The nanoporous silicon may be made to be very thin, which can reduce the thickness of the insulating dielectric layer and meet the needs of decreasing sizes of integrated circuits, chips and TFT-LCDs. The nanoporous silicon itself is hydrophobic.

Exemplarily, the second component includes a germanium nanoparticle. A dielectric constant of germanium is 16, and the dielectric constant of the insulating dielectric layer 22 can be increased by adjusting a ratio of the germanium, and of course other metal with high dielectric constant or other material may be used instead.

Exemplarily, the first component includes a nanoporous silicon, and the second component includes a germanium nanoparticle. The nanoporous silicon may be made to be very thin, which can reduce the thickness of the insulating dielectric layer and can meet the needs of decreasing sizes of integrated circuits, chips and TFT-LCDs. The nanoporous silicon itself is hydrophobic. The dielectric constant of germanium is 16, the nanoporous silicon itself has a lot of silicon holes, the germanium nanoparticle may be stored in the silicon holes and thus would not increase the thickness of the nanoporous silicon, and a controllable adjustment of dielectric constant is realized by adjusting the loading of the germanium nanoparticle.

The insulating dielectric layer 22 includes the nanoporous silicon. The nanoporous silicon includes a plurality of hollow cylindrical subassemblies 221 connected with one another. A cross-section of each subassembly 221 is hexagonal, the subassembly 221 has a circular through hole in the middle thereof, the circular through hole of the subassembly 221 has a plurality of silicon holes, and the silicon holes are disposed with the germanium nanoparticle. The hexagonal cross-section of the subassembly 221 of the porous silicon facilitates the plurality of subassemblies 221 to be spliced together, the silicon holes are disposed with multiple germanium nanoparticles and thus the thickness of the porous silicon is not affected.

An amorphous silicon layer 23 is disposed on the insulating dielectric layer 22 and corresponding to a gate conductor segment 211. An ohmic contact layer 24 is disposed on the amorphous silicon layer 23 and corresponding to the amorphous silicon layer 23. A source conductor segment 25 and a drain conductor segment 26 are separated from each other and disposed on the ohmic contact layer 24. The source conductor segment 25 and the drain conductor segment 26 have a channel 27 formed therebetween, and the channel 27 penetrates through the ohmic contact layer 24. The amorphous silicon layer 27 is located at the bottom of the channel 27. Widths of the source conductor segment 25 and the drain conductor segment 26 each are equal to a width of the ohmic contact layer 24 contacted therewith. A second insulating layer 30 as a protective layer is disposed on the source conductor segment 25 and the drain conductor segment 26. A pixel electrode layer 50 is disposed on the second insulating layer 30. The second insulating layer 30 is formed with a via hole 28 corresponding to the drain conductor segment 26, and the pixel electrode layer 50 is connected with the drain conductor segment 26 by the via hole 28. The low-k insulating layer 30 located outside the source conductor segment 25 is directly connected with the insulating dielectric layer 22. The insulating dielectric layer 22 corresponding to the via hole 28 has the amorphous silicon layer 23, the ohmic contact layer 24 and the drain conductor segment 26 sequentially stacked thereabove in that order. Therefore, a thin film transistor with better performance can be obtained by a four-mask process, and further one mask step is saved.

Figure 6:
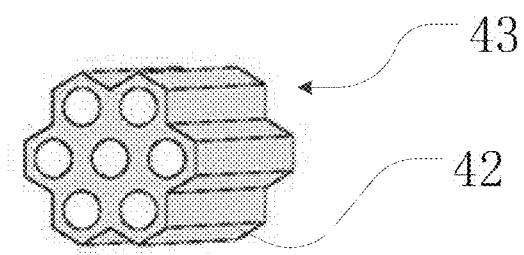
FIG. 6 is a schematic view of a mesoporous silica according to an embodiment of the disclosure.

As shown in FIG. 2, FIG. 3 and FIG. 6, the display panel of the embodiment associated with the FIG. 2, FIG. 3 and FIG. 6 includes: a substrate 10; a plurality of first-layer wires 21, the plurality of first-layer wires 21 being disposed on the substrate 10; an insulating dielectric layer 22, the insulating dielectric layer 22 being disposed on the plurality of first-layer wires 21. A dielectric constant of the insulating dielectric layer 22 is greater than dielectric constants of silicon oxide layer and silicon nitride layer. The insulating dielectric layer 22 includes a composition, and the composition includes a first component and a second component.

A relative dielectric constant of a second insulating layer 30 is smaller than relative dielectric constants of silicon nitride and silicon oxide. The use of low-k (i.e., low dielectric constant) protective layer may improve device performance of thin film transistor and relieve problems of signal crosstalk and delay of RC circuit.

Exemplarily, an amorphous silicon layer 23 is disposed on the insulating dielectric layer 22 and corresponding to a gate conductor segment 211. An ohmic contact layer 24 is disposed on the amorphous silicon layer 23 and corresponding to the amorphous silicon layer 23. The ohmic contact layer 24 has separated source conductor segment 25 and drain conductor segment 26 disposed thereon. The source conductor segment 25 and the drain conductor segment 26 have a channel 27 formed therebetween, the channel 27 penetrates through the ohmic contact layer 24, and the amorphous silicon layer 23 is located at the bottom of the channel 27. Widths of the source conductor segment 25 and the drain conductor segment 26 each are greater than a width of the amorphous silicon layer 23 contacted therewith. A second insulating layer 30 as a protective layer is disposed on the source conductor segment 25 and the drain conductor segment 26. A pixel electrode layer 50 is disposed on the second insulating layer 30. The second insulating layer 30 is provided with a via hole 28 corresponding to the drain conductor segment 26. The pixel electrode layer 50 is connected with the drain conductor segment 26 by the via hole 28. For a portion of the source conductor segment 25 beyond the amorphous silicon layer 23, a side thereof is directly connected with the insulating dielectric layer 22 and another side thereof is directly connected with the low-k protective layer. A portion of the insulating dielectric layer 22 corresponding to the via hole 28 is directly connected with the drain conductor segment 26.

Exemplarily, an amorphous silicon layer 23 is disposed on the insulating dielectric layer 22 and corresponding to a gate conductor segment 211. An ohmic contact layer 24 is disposed on the amorphous silicon layer 23 and corresponding to the amorphous silicon layer 23. A source conductor segment 25 and a drain conductor segment 26 are separated from each other and disposed on the ohmic contact layer 24. The source conductor segment 25 and the drain conductor segment 26 have a channel 27 formed therebetween, the channel 27 penetrates through the ohmic contact layer 24, and the amorphous silicon layer 23 is located at the bottom of the channel 27. Widths of the source conductor segment 25 and the drain conductor segment 26 each are equal to a width of the ohmic contact layer 24 contacted therewith. A second insulating layer 30 as a protective layer is disposed on the source conductor segment 25 and the drain conductor segment 26. A pixel electrode layer 50 is disposed on the second insulating layer 30, the second insulating layer 30 is formed with a via hole 28 corresponding to the drain conductor segment 26, and the pixel electrode layer 50 is connected with the drain conductor segment 26 by the via hole 28. The low-k protective layer located outside the of source conductor segment 25 is directly connected with the insulating dielectric layer 22. A portion of the insulating dielectric layer 22 corresponding to the via hole 28 has the amorphous silicon layer 23, the ohmic contact layer 24 and the drain conductor segment 26 sequentially stacked thereabove in that order.

The low-k protective layer includes a mesoporous silica. A relative dielectric constant of the mesoporous silica is εr=1.4~2.4. The low-k protective layer uses the mesoporous silica to replace the protective layer material of SiNx (a relative dielectric constant is εr=7~8) in the thin film transistor device obtained by a five-mask or a four-mask process, the mesoporous silica has a lower εr than the conventional silicon oxide (a relative dielectric constant is εr=3.9~4.1), which can improve the device performance of thin film transistor, improve problems of signal crosstalk and delay of RC circuit, and reduce the thickness of the low-k protective layer. Of course, the low-k dielectric layer may use other material with low-k for example nanoporous silicon.

The mesoporous silica includes a plurality of sub-units 43, each sub-units 43 includes sub-parts 42 arranged in three rows. The middle row of the sub-unit 43 includes three sub-parts 42 juxtaposed with one another, the first row and the third row of the sub-unit 43 each includes two sub-parts 42 juxtaposed with each other. The two sub-parts 42 of each of the first row and the third row each are located between any two sub-parts 42 of the three sub-parts 42 in the middle row. In other words, each of the sub-units 43 includes seven sub-parts 42 arranged in such a manner that one sub-part 42 is surrounded and connected by the other six sub-parts 42. A cross-section of the sub-part 42 is hexagonal, and the sub-part 42 has a circular through hole in the middle thereof. The sub-unit 43 has sub-parts 42 arranged in a regular order, and thus has a high specific surface area, good thermal stability and water heat stability. Sizes of through holes of the sub-parts 42 are even and the cross-section of the sub-part 42 is hexagonal, which facilitates a plurality of sub-parts 42 to be spliced and arranged.

Figure 7:
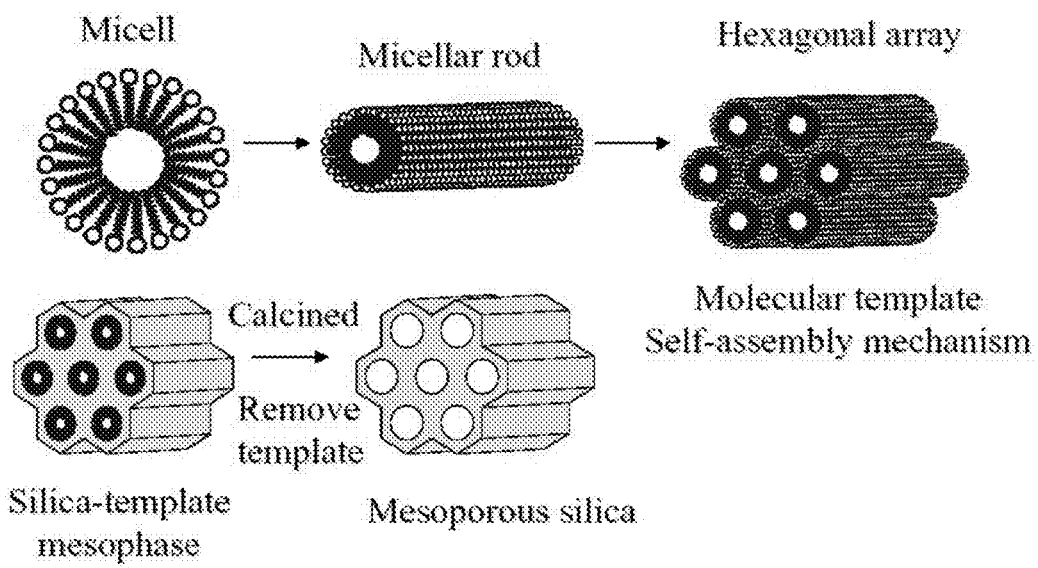
FIG. 7 is a schematic view illustrating a manufacturing process of a mesoporous silica as per an organic molecular template self-assembly mechanism according to an embodiment of the disclosure.

As shown in FIG. 7, a method of disposing a low-k protective layer with a relative dielectric constant smaller than that of silicon nitride on an active switch (such as thin film transistor) includes:

forming micellar rods from micells;

hexagonally arranging the micellar rods to form a hexagonal micellar rod array;

forming a silica-template mesophase by the hexagonal micellar rod array as per an organic molecular template self-assembly mechanism;

calcining the silica-template mesophase to remove template and thereby form a mesoporous silica; and using the mesoporous silica to form the low-k protective layer.

A relative dielectric constant of the mesoporous silica is εr=1.4~2.4, the low-k protective layer uses the mesoporous silica to replace the protective layer material SiNx (relative dielectric constant thereof is εr=7~8) of the active switches (e.g., thin film transistors) obtained by the five-mask process and the four-mask process, the εr of the mesoporous silica is lower than that of an ordinary silica (relative dielectric constant thereof is εr=3.9~4.1), which can improve performance of the active switch (e.g., thin film transistor), improve problems of signal crosstalk and delay of RC circuit and reduce the thickness of the low-k protective layer.

Figure 8:
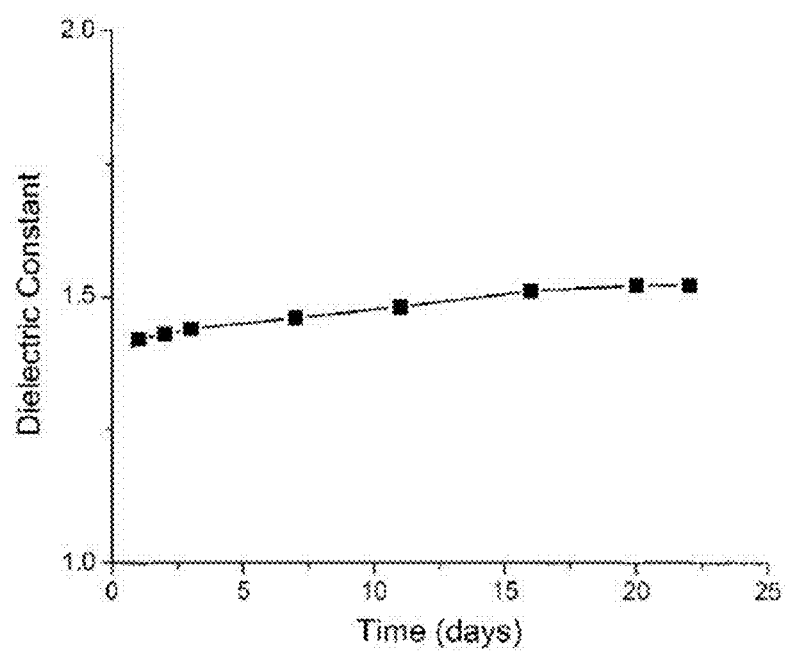
FIG. 8 is a schematic diagram of a dielectric constant testing according to an embodiment of the disclosure.

Referring to FIG. 8, the schematic diagram of a dielectric constant testing in FIG. 8 shows that: the dielectric constant of the mesoporous silica is low and stable, and further varies little along with the increase of time.

In the above embodiments, the amorphous silicon layer uses an α-Si material, and of course other semiconductor layer material can be used instead.

In the above embodiments, a material of the substrate may be glass, plastic and so on.

In the above embodiments, the display panel may be a liquid crystal panel, an OLED (organic Light Emitting Diode) panel, a QLED (quantum dot Light Emitting Diode) panel, a curved panel, a plasma panel and so on. The liquid crystal panel is taken as an example, the liquid crystal panel includes an array substrate and a color filter substrate, the array substrate and the color filter substrate are disposed opposite to each other, the array substrate and the color filter substrate have a liquid crystal and a photo spacer (PS) disposed therebetween, the array substrate has a thin film transistor disposed thereon, and the color filter substrate has a color filter layer disposed thereon.

In the above embodiment, the color filter substrate may include a TFT array, the color filter and the TFT array may be formed on the same substrate, the array substrate may include a color filter layer.

In the above embodiments, the display panel of the disclosure may be a curved panel.

The foregoing contents are detailed description of the disclosure in conjunction with specific preferred embodiments, and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A display apparatus comprising a display panel, the display panel comprising:

a substrate;

a plurality of first-layer wires, disposed on the substrate;

an insulating dielectric layer, disposed on the plurality of first-layer wires, wherein a dielectric constant of the insulating dielectric layer is higher than dielectric constants of silicon oxide and silicon nitride, the insulating dielectric layer comprises a composition, the composition comprises a first component and a second component, a dielectric constant of the first component is lower than the dielectric constants of silicon oxide and silicon nitride, a dielectric constant of the second component is higher than the dielectric constants of silicon oxide and silicon nitride, wherein an amorphous silicon layer is disposed on the insulating dielectric layer and corresponding to a gate conductor segment, an ohmic contact layer is disposed on and corresponding to the amorphous silicon layer, a source conductor segment and a drain conductor segment are separated from each other and disposed on the ohmic contact layer, a channel is disposed between the source conductor segment and the drain conductor segment, the channel passes through the ohmic contact layer, the amorphous silicon layer is located at the bottom of the channel, a width of the source conductor segment and the drain conductor segment as a whole is greater than a width of the amorphous silicon layer, a width of the amorphous silicon layer is equal to that of the ohmic contact layer, a second insulating layer is disposed on the source conductor segment and the drain conductor segment, a pixel electrode layer is disposed on the second insulating layer, the second insulating layer is provided with a via hole corresponding to the drain conductor segment, and the pixel electrode layer is connected with the drain conductor segment by the via hole, wherein a relative dielectric constant of the second insulating layer is 1.4~2.4.

2. The display apparatus as claimed in claim 1, wherein a relative dielectric constant of the second insulating layer is lower than relative dielectric constants of silicon nitride and silicon oxide, the second insulating layer comprises a mesoporous silica structure.

3. The display apparatus as claimed in claim 2, wherein the mesoporous silica structure comprises a plurality of subunits, each of the plurality of the subunits comprises seven subparts arranged in such a manner that one subpart is surrounded and connected by the other six subparts.

* * * * *